United States Patent [19]

Hjipieris et al.

[11] Patent Number: 5,061,909

[45] Date of Patent: Oct. 29, 1991

[54] ATTENUATOR SWITCHABLY COUPLED TO TRANSMISSION PATH AND MEANS FOR SWITCHABLY BREAKING THE PATH

[75] Inventors: George Hjipieris; Paul Bunyan; Martin Cryan, all of Hertfordshire, United Kingdom

[73] Assignee: Marconi Instruments Limited, Hertfordshire, United Kingdom

[21] Appl. No.: 331,783

[22] Filed: Apr. 3, 1989

[30] Foreign Application Priority Data

Apr. 12, 1988 [GB] United Kingdom ............... 8808620

[51] Int. Cl.$^5$ ............................................. H01P 1/22
[52] U.S. Cl. ............................ 333/17.2; 333/81.00 A
[58] Field of Search ................ 333/17.2, 81 R, 81 A, 333/109

[56] References Cited

U.S. PATENT DOCUMENTS

| 3,319,194 | 5/1967 | Adam | 333/81 R |
| 4,092,617 | 5/1978 | Titus | 333/81 R X |
| 4,485,360 | 11/1984 | Seward | 333/109 X |
| 4,635,297 | 1/1987 | Polischuk | 333/17.2 X |
| 4,758,793 | 7/1988 | Sheade et al. | 333/81 R X |
| 4,859,971 | 8/1989 | Edwards et al. | 333/109 |

FOREIGN PATENT DOCUMENTS 1148302 4/1965 United Kingdom .

Primary Examiner—Eugene R. Laroche
Assistant Examiner—Benny Lee
Attorney, Agent, or Firm—Lowe, Price, LeBlanc & Becker

[57] ABSTRACT

An attenuator incorporates a matched circuit which directs a portion of the input power to a power detector (25). In response to the power level reaching a threshold value an actutor breaks the circuit through the attenuator to provide reverse power protection.

11 Claims, 2 Drawing Sheets

ATTENUATOR SWITCHABLY COUPLED TO TRANSMISSION PATH AND MEANS FOR SWITCHABLY BREAKING THE PATH

BACKGROUND OF THE INVENTION

1. Field of the Invention

This invention relates to an attenuator of the type comprising a plurality of discrete attenuation portions which are switched in as desired to provide a chosen attenuation. Such an attenuator is known as a step attenuator and is often used in microwave apparatus.

A step attenuator is a component which can provide discrete attenuation levels where signal levels need to be altered. Such a need may be present in a variety of instruments, such as signal generators, sweep generators and spectrum analyzers.

2. Description of the Prior Art

The fundamental stage of a step attenuator consists of a two state switching mechanism in which one state consists of an attenuating pad and the other a nominally lossless through connection. By connecting any number of these stages in series the desired level of attenuation can be achieved. The attenuation pads are generally constructed from resistive elements such as Tantalum nitride, TaN. They have a maximum power handling capability and there is often the requirement to protect them from overload.

Overload generally arises from the measurement function of the instrument and the protection of the instrument from such overload is often termed Reverse Power Protection, hereinafter abbreviated as R.P.P.

In the past R.P.P. has been provided by a separate component situated between the step attenuator and the test port of the instrument.

Two techniques for R.P.P. are common to the art. Firstly, solid state devices such as limiter diodes have been used in two port circuits which limit the output power as the input power increases. Thus the input power to the step attenuator is limited to a level dependent on the limiter diode circuit. A disadvantage of this method is that the maximum power capability is limited by that of the solid state devices used in the limiting circuitry and the operational bandwidth may be detrimentally affected.

The second technique involves a circuit which samples a constant proportion of the input power to the step attenuator. When a predefined level of power is exceeded, an incorporated switch is open circuited thus disabling the transmission path to the step attenuator. The circuit is constructed as a separate limiting circuit unit placed between the attenuator and the test port of the instrument. The manufacture of such a discrete R.P.P. device is expensive, and causes degradation in performance, and it is desirable to integrate the R.P.P. device into the step attenuator. The present invention provides a method of achieving this.

BRIEF SUMMARY OF THE INVENTION

According to the present invention there is provided attenuating apparatus comprising: a transmission path; and attenuator: first switch means for switchably connecting the attenuator into the transmission path; and a circuit at least part of which forms part of the transmission path and switch circuit is arranged to direct a portion of a signal entering the attenuating apparatus to a power detector having an output.

The circuit is preferably a matched circuit to prevent reflection of the signal which would tend to degrade performance.

Preferably, there is provided an actuator responsive to the power detector to break connection of the edgeline to the attenuator pads when a threshold value is exceeded. The actuator is preferably an electromagnetic actuator.

The circuit may include a resistive element shaped to have a selected coupling value over a chosen bandwidth.

Advantageously, the power sampled by the detector is taken from the circuit at a point which is furthest from a transmission line. Thus, unwanted capacitive coupling is reduced.

BRIEF DESCRIPTION OF THE FIGURES

A specific embodiment of the invention will now be described by way of example with reference to the accompanying drawing in which.

DETAILED DESCRIPTION OF A PREFERRED EMBODIMENT OF THE INVENTION

Figure 1:
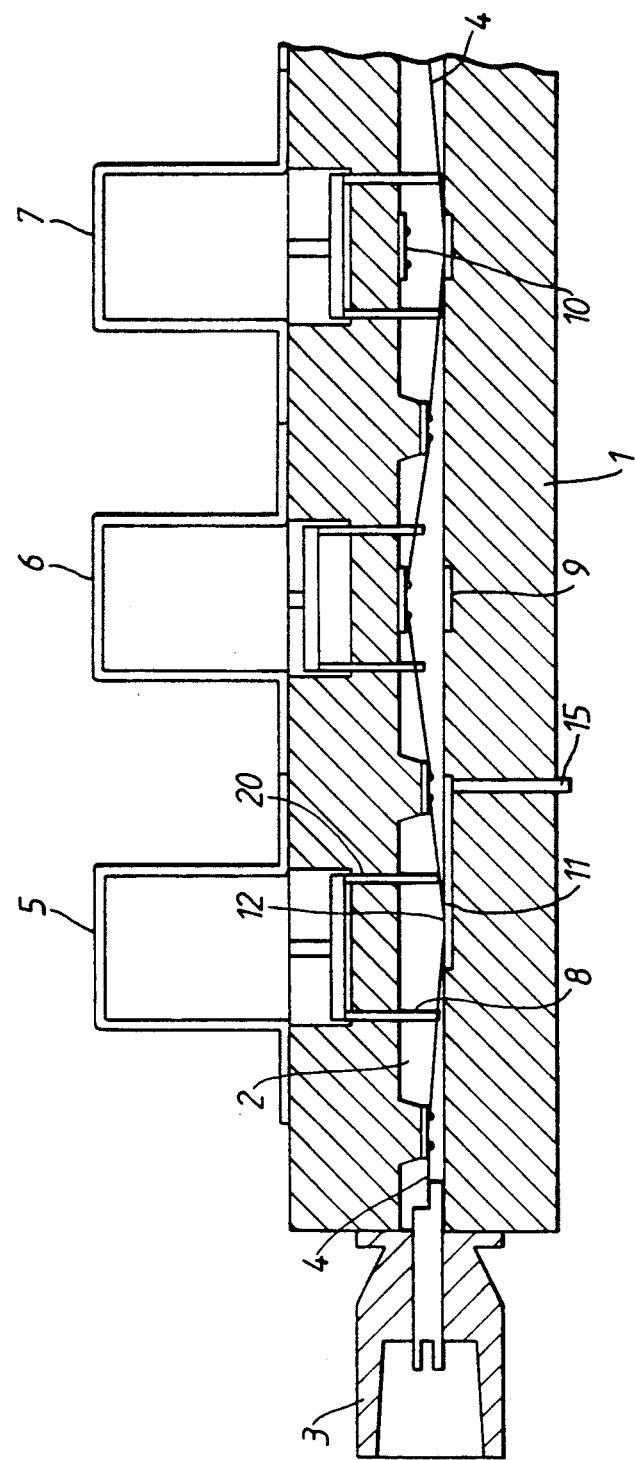
FIG. 1 shows a section through a step attenuator.

Referring to FIG. 1 a step attenuator with R.P.P. comprises an elongate body 1 having a plurality of chamber-like regions 2 spaced throughout their lengths. An input 3 for a standard 50 ohm co-axial cable is provided which connects with an edgeline transmission line 4. Respective electromagnetic actuators 5, 6, 7 are associated with each respective channel and are linked by push-rods 8 to the edgeline 4. Actuators 6 and 7 are used switchably to bias the edgeline 4 to make connection either with through connection lines 10 or with attenuator pads 9. Throughline connections 10 are nominally loss-less to produce a good conducting path and attenuator pads 9 are arranged to present a certain impedance which serves to attenuate signals passing though.

Figure 2:
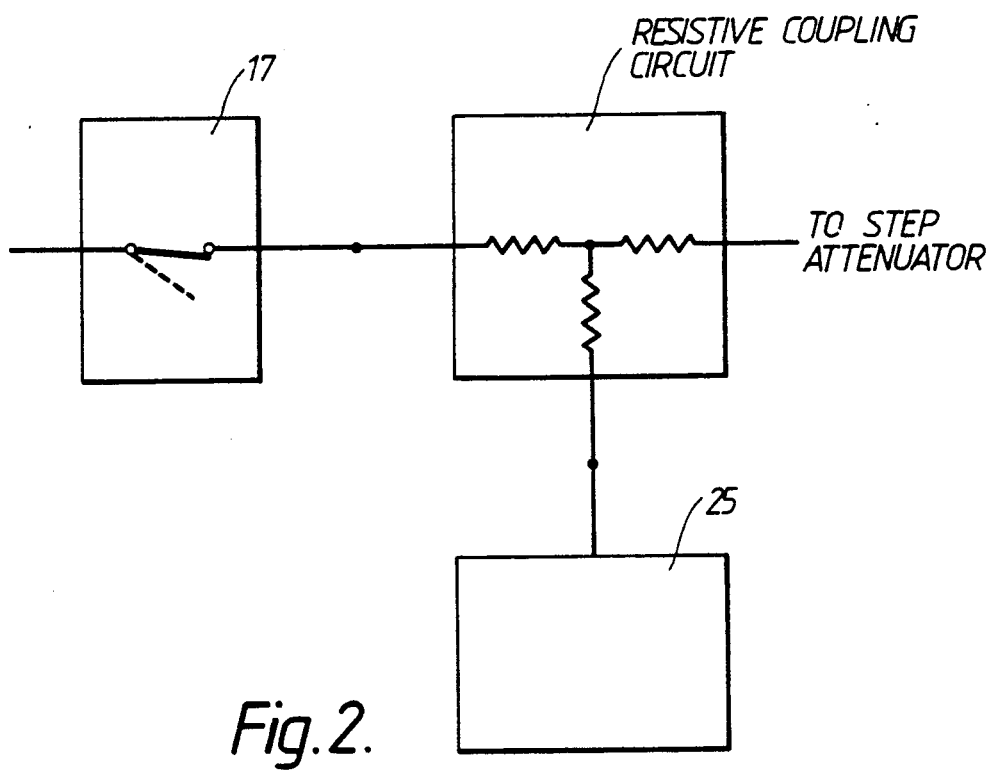
FIG. 2 is a schematic drawing of the R.P.P. system of the attenuator.
Figure 3:
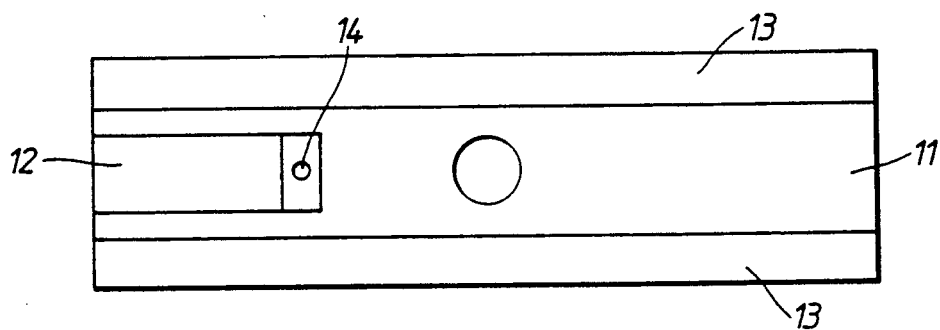
FIG. 3 is a view of the resistive circuit on a substrate as seen from above.
Figure 4:
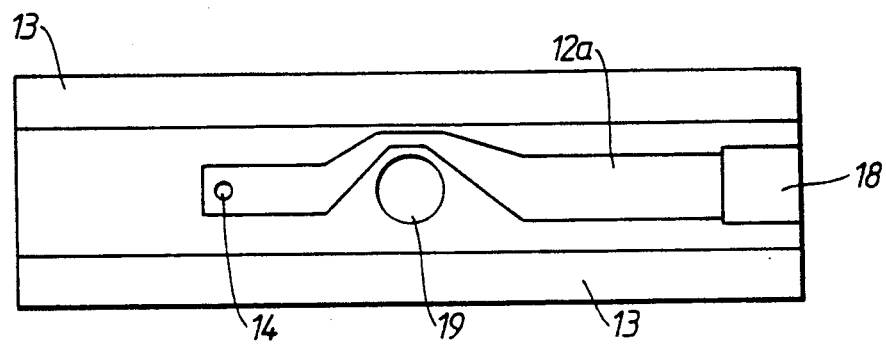
FIG. 4 is a view of the resistive circuit on a substrate of FIG. 3 as seen from below.

The first actuator 5 is associated with a chamber in which the pads 9 and 10 are omitted, and instead a substrate 11 is provided, carrying on respective sides a throughline circuit 12 and resistive circuit 12a, connected via a plated hole 14, this is more clearly shown in FIGS. 3 and 4. A gold track 13 provides a ground path to the attenuator body. A detection circuit 25 (see FIG. 2) common to the art is connected to the R.P.P. substrate 11 by an electrically conductive pin 15 (see FIG.1 ). The detection circuit 25 controls the actuator 5 so providing a two state switch shown schematically in FIG. 2 as 17.

Power is fed into the device via coaxial connection means 3 to the edge line 4 thence via the R.P.P. substrate to the first of the step attenuator stages. Steps in attenuation may be introduced by depression, for example, of push rods 8. This breaks the contact of the edgeline 4 from a loss-less connection pad and moves the edgeline 4 downwards to make contact with attenuator pad 9. Many values of attenuation may be introduced by combining the effect of two or more attenuator pads. The detection circuit (not shown in FIG. 1) is connected by a conductor in the form of a pin 15 which forms a 50 ohms impedance transmission line. The detection circuit is standard in the microwave field and has a nominal 50 ohms input impedance. The throughline and resistive coupling circuit shown schematically in FIG. 2 is produced by printing on to a substrate 11. A through line 12 for the main signal flow is printed on one side of the substrate the resistor circuit 12a is printed on the other and is designed to direct a fixed portion of the power to the detection circuit, in known manner. Connection is facilitated by a plated hole 14 through the substrate 11. The main resistor 12a has a shape optimised for broadband operation typically from DC to 10 GHz and minimum parasitic performance and is constructed from TaN to have a chosen coupling value. A gold pad 18 is in electrically conductive contact with the main resistor 12a. The pin 15, of 50 ohm impedance, makes electrically conductive contact with gold pad 18 (see FIG. 4) and passes through the body 1. To this is connected a standard detector. The pin 15 will also couple unwanted power directly from the through line in a frequency dependant fashion due to the proximity of the through line at this point. In order to minimise this undesirable coupling which will superimpose on the resistive coupling, the pin 15 is placed in a position of maximum distance from the through line. Thus the alumina substrate has a clearance hole 19 (see FIG. 4) for the push rod 20 (see FIG. 1) to pass through substrate 11 and the main resistor 12a is shaped to pass around this clearance hole 19. Further resistors may be formed on the pad throughline to match the system.

When the power detected by the standard detector exceeds a predefined level a push rod 20 is actuated to move the edgelines upwards thus breaking the step attenuator pads contact and open circuiting the edgeline. In this way power protection is achieved.

What we claim is:

1. An attenuating apparatus comprising:
    a transmission path including a resistive element shaped to have a selected substantially constant coupling value over a predetermined frequency range;
    an attenuator;
    first switch means in series with said transmission path for selectively connecting said attenuator in series into said transmission path; and
    a sampling circuit including a sampling line which forms part of the transmission path for transmitting a portion of a signal applied to said transmission path to a power detector.

2. An attenuating apparatus as claimed in claim 1 wherein the predetermined frequency range is from DC to 10 GHz.

3. An attenuating apparatus as claimed in claim 1 wherein the sampled signal is taken from a portion of the sampling line which is spaced furthest apart from the transmission path.

4. An attenuating apparatus comprising:
    a transmission path having an input end for receiving a signal and an output end for supplying an output signal, said transmission path including an in-line sampling line;
    an attenuator;
    a power detector receiving a portion of a signal from said sampling line and, in response to detecting a predetermined threshold power value of said sampling line signal, supplying a control signal;
    first switch means in series with said transmission path for selectively connecting said attenuator in series into said transmission path to attenuate a level of said signal; and
    second switch means in series with said transmission path and which is responsive to said power detector control signal to interrupt said transmission path between said input end and said sampling line in response to said power detector detecting said predetermined threshold power value.

5. An attenuating apparatus comprising:
    a transmission path;
    an attenuator;
    first switch means in series with said transmission path for selectively connecting said attenuator in series into said transmission path;
    a power detector;
    a sampling circuit including a sampling line which forms part of the transmission path for transmitting a portion of a signal applied to said transmission path to said power detector; and
    second switch means in series with said transmission path and including an electromagnetic actuator responsive to an output of said power detector to interrupt said transmission path in response to said power detector detecting a predetermined threshold power.

6. An attenuating apparatus comprising:
    a transmission path including an edgeline transmission line;
    an attenuator;
    first switch means connected to said transmission path for selectively connecting said attenuator in series into said transmission path;
    a sampling circuit, a part of said sampling circuit which forms part of said transmission path for transmitting a portion of a signal applied to said transmission path to a power detector having an output representative of the signal power; and
    second switch means responsive to the output and operatively connected to said transmission path to break said transmission path, said second switch operable when said output reaches a predetermined threshold.

7. An attenuating apparatus as claimed in claim 6 wherein the sampled signal is taken from a part of the sampling line which is physically spaced furthest away from said transmission path.

8. An attenuating apparatus as claimed in claim 6 wherein the sampling circuit is a an R.F. transmission line having a predetermined impedance.

9. An attenuating apparatus as claimed in claim 6 wherein said second switch means is an electromagnetic actuator.

10. An attenuating apparatus as claimed in claim 6 wherein said sampling circuit includes a resistive element shaped to have a substantially constant coupling value over a predetermined frequency range.

11. An attenuating apparatus as claimed in claim 10 wherein said predetermined frequency range is from DC to 10 GHz.

* * * * *